United States Patent
van der Wagt et al.

(10) Patent No.: US 9,503,065 B1
(45) Date of Patent: Nov. 22, 2016

(54) DESKEW OF RISING AND FALLING SIGNAL EDGES

(71) Applicant: Teradyne, Inc., North Reading, MA (US)

(72) Inventors: Jan Paul Antonie van der Wagt, Carlsbad, CA (US); Ron Sartschev, Dunstable, MA (US); Bradley A Phillips, Westlake Village, CA (US)

(73) Assignee: Teradyne, Inc., North Reading, MA (US)

( * ) Notice: Subject to any disclaimer, the term of this patent is extended or adjusted under 35 U.S.C. 154(b) by 0 days.

(21) Appl. No.: 14/840,498

(22) Filed: Aug. 31, 2015

(51) Int. Cl.
*H03K 17/00* (2006.01)
*H03K 5/14* (2014.01)
*H03K 3/356* (2006.01)
*G06F 1/10* (2006.01)
*H03K 3/012* (2006.01)

(52) U.S. Cl.
CPC *H03K 5/14* (2013.01); *G06F 1/10* (2013.01); *H03K 3/012* (2013.01); *H03K 3/356* (2013.01)

(58) Field of Classification Search
None
See application file for complete search history.

(56) References Cited

U.S. PATENT DOCUMENTS

| | | | |
|---|---|---|---|
| 6,252,441 B1 * | 6/2001 | Lee | G11C 7/1051 326/94 |
| 7,593,497 B2 | 9/2009 | Conner | |
| 8,094,766 B2 | 1/2012 | Conner | |
| 8,705,592 B2 | 4/2014 | Oh et al. | |
| 2008/0048905 A1 | 2/2008 | McEwan | |
| 2011/0309865 A1* | 12/2011 | Cordos | H04L 7/0338 327/153 |
| 2013/0009686 A1 | 1/2013 | Bucher et al. | |
| 2013/0027102 A1 | 1/2013 | Chen et al. | |
| 2016/0112223 A1* | 4/2016 | Kitsukawa | H04L 25/4904 375/346 |
| 2016/0173090 A1* | 6/2016 | Meinerzhagen | H03K 5/26 327/145 |

FOREIGN PATENT DOCUMENTS

KR 10-1502759 B1 3/2015

OTHER PUBLICATIONS

International Search Report for PCT/US2016/042742, 3 pages (Oct. 12, 2016).
Written Opinion for PCT/US2016/042742, 8 pages (Oct. 12, 2016).

* cited by examiner

*Primary Examiner* — Long Nguyen
(74) *Attorney, Agent, or Firm* — Choate, Hall & Stewart LLP

(57) ABSTRACT

Example circuitry includes: a first sampling circuit configured to operate based on a first clock signal, to receive data, and to sample the data, where the first clock signal is calibrated to compensate for a first timing error in a rising edge of the data; a second sampling circuit configured to operate based on a second clock signal, to receive the data, and to sample the data, where the second first clock signal is calibrated to compensate for a second timing error in a falling edge of the data; and a third sampling circuit to receive the data and a third clock signal, to sample the data based on the third clock signal to produce sampled data, and to control an output of the circuitry based on the sampled data to be either an output of the first sampling circuit or an output of the second sampling circuit.

21 Claims, 7 Drawing Sheets

DESKEW OF RISING AND FALLING SIGNAL EDGES

TECHNICAL FIELD

This specification relates generally to deskewing rising and falling signal edges and, more particularly, to a comparator that is configured to deskew rising and falling signal edges.

BACKGROUND

The rising and falling edges of a signal incur different delay errors both inside and outside of a circuit. These errors are referred to as skew, and techniques for reducing or eliminating these errors are referred to as deskewing. Heretofore, circuitry was incorporated into the data path to perform the deskewing. However, that type of circuitry has various drawbacks relating to calibration, power consumption, and size, which could lead to performance degradation in some cases.

SUMMARY

Example circuitry for deskewing rising and falling signal edges may include: a first sampling circuit configured to operate based on a first clock signal, to receive data, and to sample the data, where the first clock signal is calibrated to compensate for a first timing error in a rising edge of the data; a second sampling circuit configured to operate based on a second clock signal, to receive the data, and to sample the data, where the second first clock signal is calibrated to compensate for a second timing error in a falling edge of the data; and a third sampling circuit to receive the data and a third clock signal, to sample the data based on the third clock signal to produce sampled data, and to control an output of the circuitry based on the sampled data to be either an output of the first sampling circuit or an output of the second sampling circuit. The example circuitry may include one or more of the following features, either alone or in combination.

The example circuitry may include a first delay element to receive the third clock signal and to delay the third clock signal by a first amount to produce the first clock signal; and a second delay element to receive the third clock signal and to delay the third clock signal by a second amount to produce the second clock signal. The first amount may be independent of, and different from, the second amount. The first amount may be based on the first timing error, and the second amount may be based on the second timing error.

The example circuitry may include a selection circuit configured to receive an output of the third sampling circuit, and to use the output of the third sampling circuit to select either the output of the first sampling circuit or the output of the second sampling circuit. The selection may include a multiplexer controlled by the output of the third sampling circuit.

The third sampling circuit may be configured to sample the data prior to sampling performed by at least one of the first sampling circuit or the second sampling circuit. The third sampling circuit may be configured to sample the data after sampling performed by at least one of the first sampling circuit or the second sampling circuit. The third sampling circuit may be configured to sample the data before and after sampling performed by at least one of the first sampling circuit or the second sampling circuit.

The example circuitry may include a fourth sampling circuit to receive the output of the circuitry and a fourth clock signal; and one or more delay elements to generate the fourth clock signal based on the third clock signal. The one or more delay elements may introduce a delay into the third clock signal to produce the fourth clock signal. The delay is for ensuring that the fourth clock signal controls the fourth sampling circuit to sample the output when the output has a valid signal level. The delay of the one or more delay elements may be fixed or programmable.

In an example operation of the circuitry described herein, when the data is in a low state, the third sampling circuit is configured to control the output of the circuitry to be the output of the first sampling circuit; and when the data is in a high state, the third sampling circuit is configured to control the output of the circuitry to be the output of the second sampling circuit.

The first sampling circuit may include a flip-flop, the second sampling circuit may include a flip-flop, and the third sampling circuit may include a flip-flop. The first timing error includes a skew associated with the rising edge of the data, and the second timing error includes a skew associated with the falling edge of the data.

An example circuit for detecting data crossing a threshold may include: an input circuit configured to provide data at a first frequency; a clock circuit configured to provide a data clock signal at a second frequency, where the second frequency is different than the first frequency; sampling circuitry configured to sample the data based on the data clock signal to produce sampled data; and a detection circuit configured to detect that the sampled data crossed the threshold and, in response, to provide output data. The sampling circuitry may include: a first sampling circuit configured to operate based on a first clock signal, to receive data, and to sample the data, where the first clock signal is calibrated to compensate for a first timing error in a rising edge of the data, and where the first clock signal is based on the data clock signal; a second sampling circuit configured to operate based on a second clock signal, to receive the data, and to sample the data, where the second first clock signal is calibrated to compensate for a second timing error in a falling edge of the data, and where the second clock signal is based on the data clock signal; and a third sampling circuit to receive the data and the data clock signal, to sample the data based on the data clock signal to produce sampled data, and to control an output of the sampling circuitry based on the sampled data to be either an output of the first sampling circuit or an output of the second sampling circuit. The example circuit for detecting data crossing a threshold may include one or more of the following features, either alone or in combination.

The threshold may be a zero crossing threshold. The data may be part of a differential signal, and the threshold may include signals that included the differential signal crossing each other.

The sampling circuitry may include a first delay element to receive the data clock signal and to delay the data clock signal by a first amount to produce the first clock signal; and a second delay element to receive the data clock signal and to delay the data clock signal by a second amount to produce the second clock signal. The first amount may be independent of, and different from, the second amount. The first amount may be based on the first timing error, and the second amount may be based on the second timing error.

The sampling circuitry may include a selection circuit configured to receive an output of the third sampling circuit, and to use the output of the third sampling circuit to select either the output of the first sampling circuit or the output of the second sampling circuit.

Any two or more of the features described in this specification, including in this summary section, can be combined to form implementations not specifically described herein.

The test systems and techniques described herein, or portions thereof, can be implemented as/controlled by a computer program product that includes instructions that are stored on one or more non-transitory machine-readable storage media, and that are executable on one or more processing devices to control (e.g., coordinate) the operations described herein. The test systems and techniques described herein, or portions thereof, can be implemented as an apparatus, method, or electronic system that can include one or more processing devices and memory to store executable instructions to implement various operations.

The details of one or more implementations are set forth in the accompanying drawings and the description below. Other features and advantages will be apparent from the description and drawings, and from the claims.

DESCRIPTION OF THE DRAWINGS

Like reference numerals in different figures indicate like elements.

DETAILED DESCRIPTION

Described herein are examples of circuits used to deskew rising and falling edges of a signal. The concepts described herein, however, are not limited to the examples provided, and may be used in any appropriate context.

Figure 1:
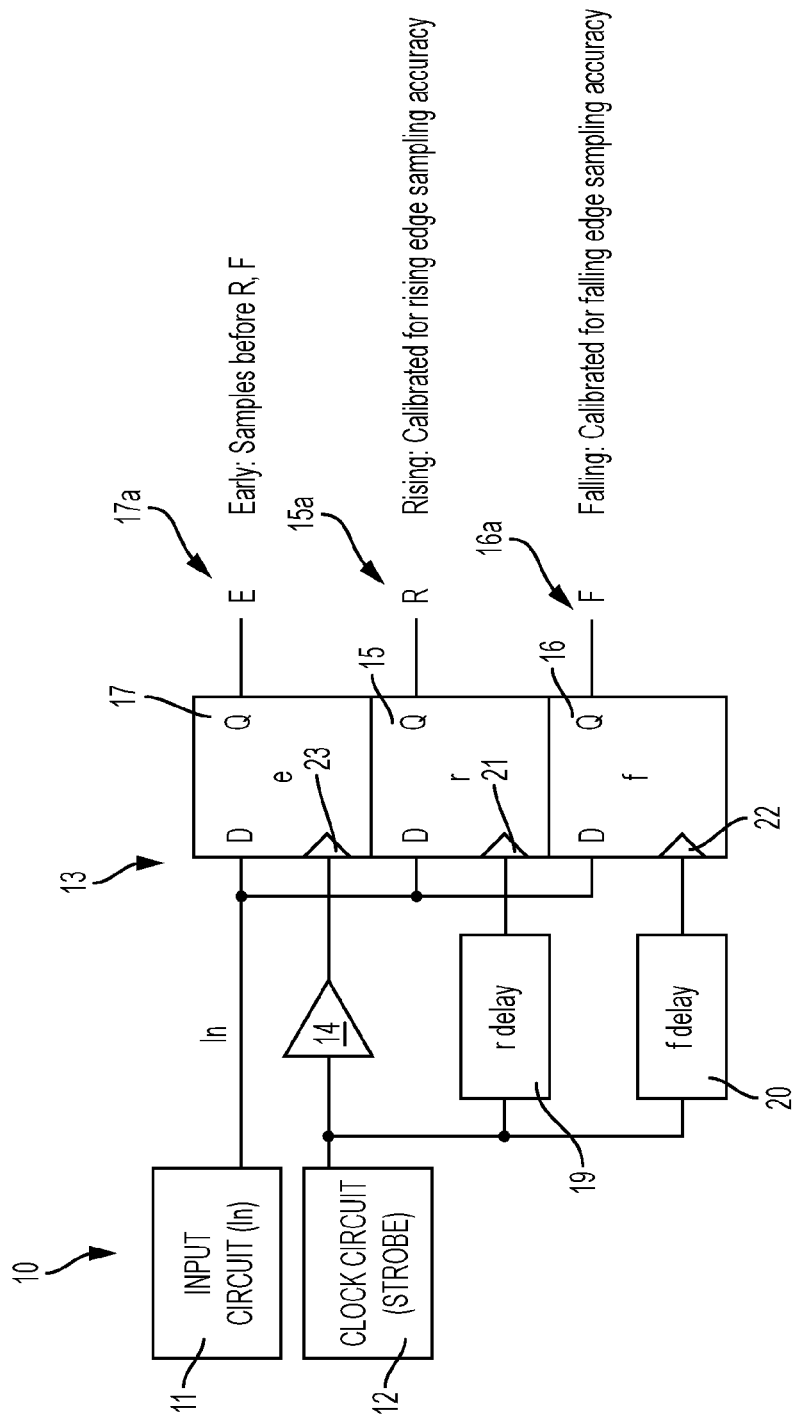
FIG. 1 is a block diagram of an example comparator circuit.

FIG. 1 shows an example of a comparator circuit 10 that implements deskewing of rising and falling signal edges independently. A rising edge includes a signal transition from a low state (e.g., zero) to a high state (e.g., one), and a falling edge includes a signal transition from high state (e.g., one) to a low state (e.g., zero). In the example of FIG. 1, the comparator circuit includes a signal input circuit 11, a clock circuit 12, and three sampling circuits 13. The three sampling circuits all sample the same data (e.g., from a parallel connection), but each sampling circuit receives a different clock (or "strobe"). In this example, each sampling circuit is, or includes, an edge-triggered D-flip-flop (DFF). However, in other implementations, other types of sampling circuits may be used.

The independent sampler deskew approach described herein is an alternative to the use of more traditional input data path deskew circuit that operates on both edges. A traditional in-line deskew circuit (in which deskew circuitry was incorporated into the data path) has drawbacks in terms of affecting the high-speed performance of the data path up to the samplers and, in some cases, may add substantially more circuitry than the independent sampler approach, which in turn can result in higher power dissipation and chip area in some cases. An in-line deskew circuit typically cannot serve multiple comparator blocks to reduce power and area, since each comparator block contributes independently to the skew.

In the example of FIG. 1, the first sampling circuit 15, labeled r (for "rising"), is calibrated for accurate sampling of rising signal edges by adding a delay to the strobe input thereto. The second sampling circuit 16, labeled f (for "falling"), is calibrated for accurate sampling of falling signal edges by adding a delay to the strobe input thereto. The third sampling circuit 17, labeled "e" (for early), samples the input signal before the sampling performed by r 15 and f 16 in order to determine the state (high or low) prior to transition. The output of e 17 is used to determine whether a transition under consideration is a rising or falling edge and to select, as output of the comparator circuit, the output of r 15 (R 15a) if the edge is rising or the output off 16 (F 16a) if the edge is falling.

More specifically, each sampling circuit, r 15, f 16, and e 17, receives, at its D input, the same signal (In) from input circuit 11. Each sampling circuit, r 15, f 16, and e 17 also receives a different strobe 17 at its respective clock input. In this example, the strobe may be applied directly, or through a buffer 14, to e 17. The strobe is applied to r 15 and f 16 through respective delay elements r delay 19 and f delay 20. These delay elements are calibrated (e.g., programmed with a timing delay) so that r 15 provides rising edge sampling accuracy, but not necessary falling edge sampling accuracy, and so that f 16 provides falling edge sampling accuracy, but not necessarily rising edge sampling accuracy. The time delays programmed into r delay 19 and f delay 20 are independent, and each address different timing errors in their respective sampling circuits. As such, the delay elements can reduce skew in rising and falling signal edges resulting from circuitry inside or outside of a chip. Sampling circuits r 15 and f 16 may themselves contribute to skew before adjustment of the strobe delays r 19 and f 20. In some implementations, sampling circuit e 17 samples the signal In earlier in time than either of sampling circuits r 15 or f 16. As described herein, by sampling the input signal earlier, it is possible to determine the state of the input signal prior to transition, and thus which sampling circuit output provides better skew reduction.

In operation, r 15 receives a signal (In) at its D input and a strobe at its clock input 21, and outputs, at its Q output, R 15a, a value of one ("1") if the signal is high and a value of zero ("0") if the signal is low. Whether the signal is deemed high or low depends upon whether the signal exceeds a set threshold. Similarly, f 16 receives a signal (In) at its D input and a strobe at its clock input 22, and outputs, at its Q output, F 16a, a value of one ("1") if the signal is high and a value of zero ("0") if the signal is low. Similarly, e 17 receives a signal (In) at its D input and a strobe at its clock input 23, and outputs, at its Q output, E 17a, a value of one ("1") if the signal is high and a value of zero ("0") if the signal is low. The value at E 17a is used to select which of the sampled outputs, R 15a or F 16a, to use as the output of comparator circuit 10.

In this regard, since e 17 samples before r 15 and f 16, the state of the signal In (e.g., whether it is low or high prior to transition) is known prior to sampling performed by r 15 and f 16. So, if the value of R 15*a* or F 16*a* is high and the value of E 17*a* is low, this means that the signal In was previously low and is now high, meaning that the signal has risen (the transition was a rising edge). As such, the signal at R 15*a*, from the sampling circuit (r 15) that is calibrated for accurate sampling of rising edges by setting r delay 19, is selected as output of the comparator circuit. By contrast, if the value of R 15*a* or F 16*a* is low and if the value of E 17*a* is high, that means that the signal In was previously high and is now low, meaning that the signal has fallen (the transition was a falling edge). As such, the signal at F 16*a*, from the sampling circuit (f 16) that is calibrated for accurate sampling of falling edges by setting f delay 20, is selected as output for the comparator circuit. This operation of comparator circuit 10 is described in more detail with respect to FIGS. 2 and 3 below.

Thus to summarize, two of the sampling circuits, r 15 and f 16 are independently calibrated so that r 15 is more accurate for rising edges than f 16, and so that f 16 is more accurate for falling edges and r 15. This calibration is performed by adjusting the respective strobe delays, r delay 19 and f delay 20 of r 15 and f 16. In mission mode, assuming a clock on the clock input, and time-varying data from the input circuit on their respective D inputs, r 15 and f 16 output two streams of zeros and ones, one on each of terminals R 15*a* and F 16*a*. From these data streams, it is not possible to tell which one of them is more correct (e.g., less skewed). In cases where R 15*a* and F 16*a* differ, it is determined, from the output of sampling circuit e 17, whether the respective sampling circuit r 15 or f 16 was sampling near a rising input signal transition or near a falling input signal transition, since sampling circuit r is more accurate near a transition if the transition is rising, and since sampling circuit f is more accurate near a transition if the transition is falling. In the case of a rising transition, the R 15*a* output data is deemed accurate and is used as the comparator's output, whereas in the case of a falling transition, the F 16*a* output data is deemed accurate and is used as the comparator's output.

Figures 2, 3:
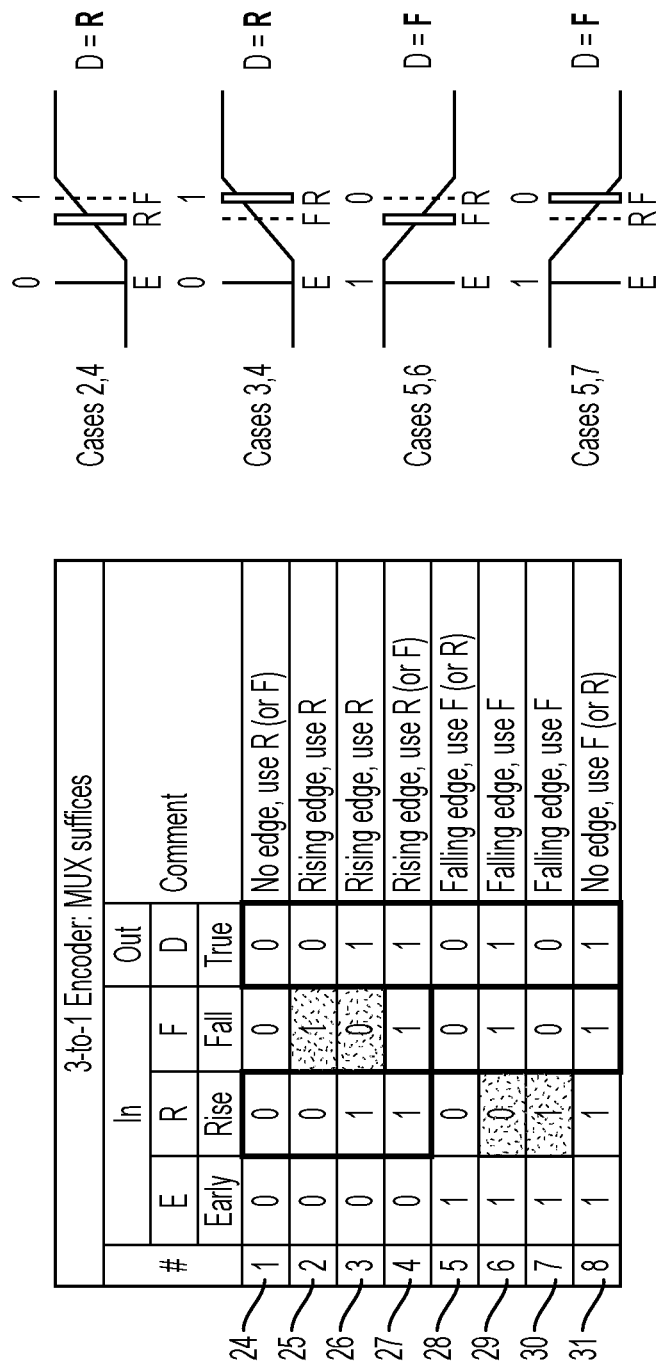
FIG. 2 is a table showing operation of the comparator circuit of FIG. 1.
FIG. 3 includes graphs showing states represented in the table of FIG. 2.

FIG. 2 shows operation of the circuitry of FIG. 1 under different circumstances, and FIG. 3 shows those circumstances graphically. Specifically, the columns labeled E, R, and F correspond to the outputs at E 17*a*, R 15*a*, and F 16*a* of FIG. 1. The column labeled D indicates which output, that of r 15 (namely R 15*a*) or that of f 16 (namely F 16*a*) is to be the output of the comparator circuit. The column labeled "#" indicates the case number, referring to the cases in the graphs of FIG. 3.

In FIG. 2, in case 1 24, E 17*a* is zero indicating a low value for the input signal (In), R 15*a* is zero, and F 16*a* is zero. In this case, both sampling circuit outputs (R 15*a* and F 16*a*) indicate a low value (zero) and E 17*a* indicates that the signal is low. Therefore, no transition is detected, and the signal edge is neither rising nor falling. In that case, there is no additional skew caused by rising or falling. Accordingly, the output (D) of the comparator circuit may be either of the outputs R 15*a* or F 16*a*.

In case 2 25 (FIG. 2), E 17*a* is zero indicating a low value for the input signal (In), R 15*a* is zero, and F 16*a* is one. In this case, sampling circuit output F 16*a* indicates a high value (one) and E 17*a* indicates that the signal is low prior to transition. Therefore, a rising edge is identified, in which case the output of the sampling circuit calibrated for rising edges (r 15) is selected as the D output ("Rising edge use R"; D=R). In case 3 26, E 17*a* is zero indicating a low value for the input signal (In), R 15*a* is one, and F 16*a* is zero. In this case, one sampling circuit output R 15*a* indicates a high value (one) and E 17*a* indicates that the signal is low prior to transition. Therefore, a rising edge is identified, in which case the output of the sampling circuit calibrated for rising edges (r 15) is selected as the D output ("Rising edge use R"; D=R). In case 4 27, E 17*a* is zero indicating a low value for the input signal (In), R 15*a* is one, and F 16*a* is one. In this case, both sampling circuit outputs R 15*a* and F 16*a* indicate a high value (one) and E 17*a* indicates that the signal is low prior to transition. Therefore, a rising edge is identified, in which case the output of the sampling circuit calibrated for rising edges (r 15) is selected as the D output ("Rising edge use R"; D=R). It is also acceptable to select the output of the sampling circuit calibrated for falling edges (f 16) in this case, since the outcome is a high value (one) in that case as well. That is, there are two rising edge cases in FIG. 2, namely 24, and 27, where both samplers provide the same output (both "0" or both "1") and thus either of these outputs may be trusted as the correct output. However, it may be advantageous for simplicity of implementation to choose the rising edge accurate sampler output for all four cases 24, 25, 26, and 27.

In case 5 28, E 17*a* is one indicating a high value for the input signal (In), R 15*a* is zero, and F 16*a* is zero. In this case, both sampling circuit outputs R 15*a* and F 16*a* indicate a low value (zero) and E 17*a* indicates that the signal is high prior to transition. Therefore, a falling edge is identified, in which case the output of the sampling circuit calibrated for falling edges (f 16) is selected as the D output ("Rising edge use F"; D=F). It is also acceptable to select the output of the sampling circuit calibrated for rising edges (f 15) in this case, since the outcome is a low value (zero) in that case as well. That is, there are two falling edge cases in FIG. 2, namely 28, and 31, where both samplers provide the same output (both "0" or both "1") and thus either of these outputs may be trusted as the correct output. However, it may be advantageous for simplicity of implementation to choose the falling edge accurate sampler output for all four cases 28, 29, 30, and 31.

In case 6 29, E 17*a* is one indicating a high value for the input signal (In), R 15*a* is zero, and F 16*a* is one. In this case, one sampling circuit output R 15*a* indicates a low value (zero) and E 17*a* indicates that the signal is high prior to transition. Therefore, a falling edge is identified, in which case the output of the sampling circuit calibrated for falling edges (f 16) is selected as the D output ("Falling edge use F"; D=F). In case 7 30, E 17*a* is one indicating a high value for the input signal (In), R 15*a* is one, and F 16*a* is zero. In this case, one sampling circuit output F 16*a* indicates a low value (zero) and E 17*a* indicates that the signal is high prior to transition. Therefore, a falling edge is identified, in which case the output of the sampling circuit calibrated for falling edges (f 16) is selected as the D output ("Falling edge use F"; D=F).

in case 8 31, E 17*a* is one indicating a high value for the input signal (In), R 15*a* is one, and F 16*a* is one. In this case, both sampling circuit outputs R 15*a* and F 16*a* indicate a high value (one) and E 17*a* indicates that the signal is high. Therefore, no transition is detected, and the signal edge is neither rising nor falling. In that case, there is no additional skew caused by rising or falling. Accordingly, the output (D) of the comparator circuit may be either of the outputs R 15*a* or F 16*a*.

Figure 4:
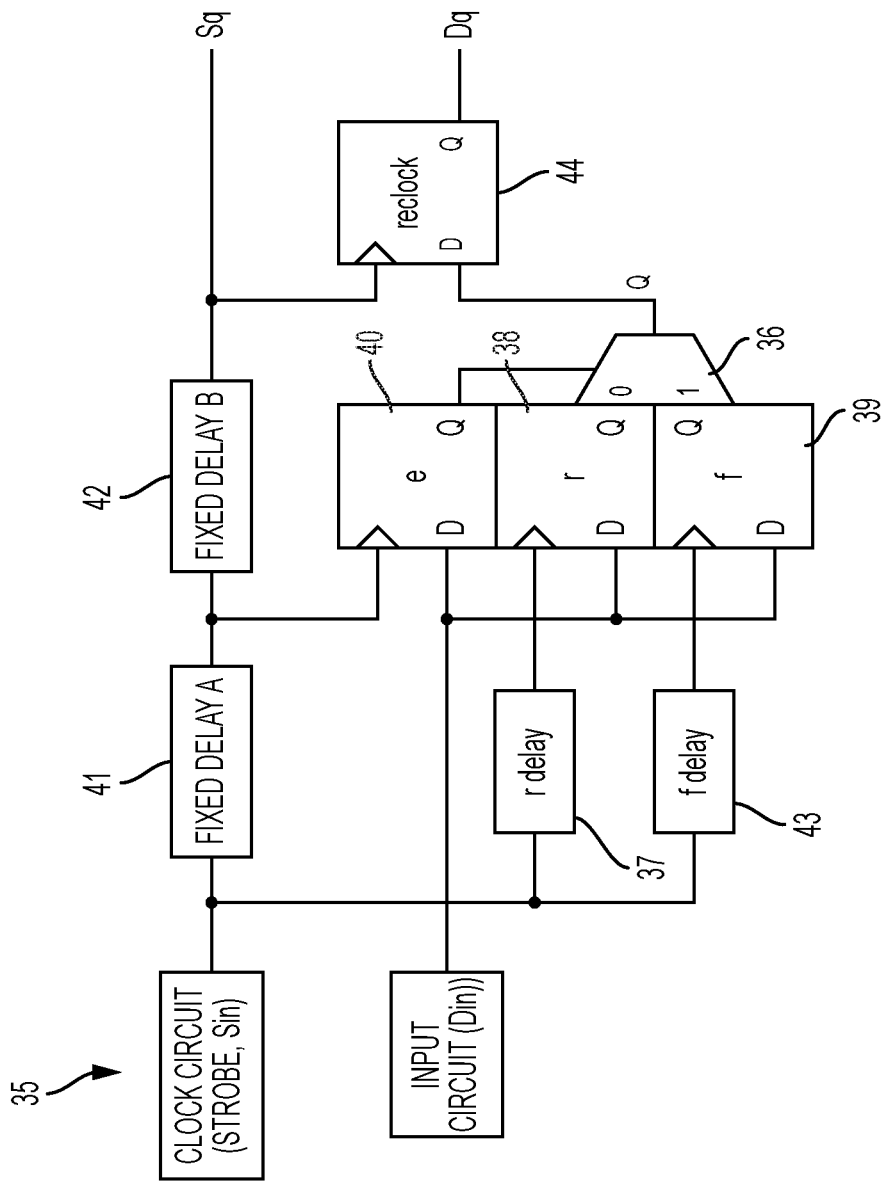
FIG. 4 is a block diagram of another example comparator circuit.

Thus, FIGS. 2 and 3 illustrate how the circuitry described herein generates a deskewed output by selection of R or F when output E is 0 or 1, respectively. The selection circuitry can be implemented using, e.g., a multiplexer (MUX). An implementation of comparator circuit 35 that incorporates such a multiplexer 36 is shown in FIG. 4. In the implementation of FIG. 4, there are three sampling circuits 38, 39, and 49, r delay 37, and f delay 43. These circuit elements may be identical in structure and function to their counterparts described above with respect to FIG. 1. A multiplexer 36 receives the outputs of r 38, f 39, and e 40. The output of e 40 is applied to the selection line of multiplexer 36, and is thus used to select, for output, either the output of r 38 or the output off 39. Output selection is implemented according to the table of FIG. 2 under the circumstances of FIG. 3.

Although use of a multiplexer may have implementation advantages, other circuitry to affect the selection of the r 15 and f 16 outputs to a single output may be used. Any appropriate circuitry that selects, for any of the eight rows in FIG. 2, only outputs from r 15 and f 16 in the following blocks in the R and F columns in FIG. 2 is functionally appropriate: 1R, 1F, 2R, 3R, 4R, 4F, 5R, 5F, 6F, 7F, 8R, 8R, where the number refers to case (#) and the letter refers to whether it is from the rising (R) or falling (F) column of the table. For instance, a circuit that always picks the "R" column output to become the "D" (true) output, except for cases 29 and 30, in which it picks the "F" column output, fulfills the functional correctness requirement.

FIG. 4 also shows delays 41 and 42 incorporated into the strobe 40 to place the position of the strobe early relative the r and f delays, which have a base delay, even at their minimum delay setting. In this example, delays 41 and 42 are fixed at respective delays A and B. In an example, delays A and B are fixed to values that ensure correct operation or are adjustable to improve the timing margin of the circuit. Accordingly, one or both of delays 41 and 42 may be fixed or programmable to any appropriate values.

In some implementations, the rising and falling edge delay values may be quite different (in some examples, by as much as 10% of the strobe, Sin, time separation). Accordingly, delays 41 and 42 may be selected to enable proper re-clocking of the output data relative to the input strobe signal, Sin. More specifically, in FIG. 4, since the sampling circuit output data edges (at flip-flop outputs, Q) are defined relative to a local clock (or strobe) domain (which different from the Sin global strobe domain), a re-clock may be used to bring the data into a fixed relationship with the input clock Sin, e.g., independent of the rising and falling delay settings. In this implementation, a re-clock flip flop 44 is used to perform the re-clocking; however other types of circuitry may be used. Re-clock flip flop 44 receives the output of multiplexer 36 at its D input, and is clocked by a delayed version of Sin (Sq) to thereby output data Dq that is clocked in accordance with the global strobe domain, Sin.

Figure 5:
FIGS. 5 and 6 are graphs showing examples of errors resulting from sampling that occurs too early or too late in a signal.
Figure 6:
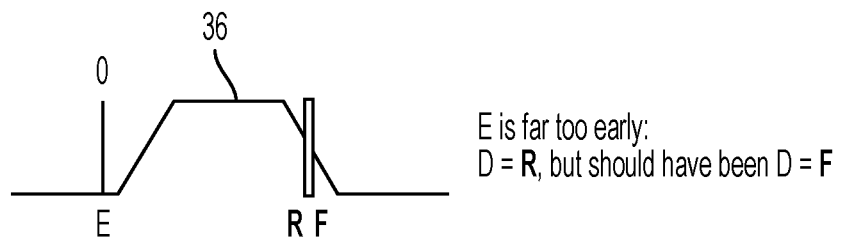

FIG. 5 shows the placement in time of the early sampling strobe (E) relative to rising and falling sampling strobes (R, F). If the early sampling strobe is delayed too much, the early sampling circuit (e.g., e 17, e 40) samples later rather than earlier relative to the rising and falling sampling circuits. As a result, the E output will be one rather than zero, leading to a wrong decision for the output, D. If the early sampling strobe is delayed too little, then for large rising and falling delay settings (as shown in FIG. 6), an entire input data up-down (or down-up) transition pair 36 may fit between the sampling times of the early sampling circuit and the rising and falling sampling circuits. As a result, the improper output, D, is again selected. Generally, enough margin should be left to place the early sampling strobe so that both of the situations show in FIGS. 5 and 6 can be avoided or otherwise mitigated.

In some implementations, instead of performing early sampling to detect rising and falling edges, late sampling (or "l" sampling) may be used. That is, rather than sampling prior to a rising or falling edge, sampling may be performed after the rising or falling edge. The results of that sampling may be used to determine whether the prior edge was rising or falling edge, and may be used to select whether to use, as output of a comparator circuit, the output of a first sampling circuit calibrated for accurate sampling of rising edges or the output of a second sampling circuit calibrated for accurate sampling of falling edges. For example, if the first or second sampling circuit indicates that the signal is high, and the late sampling circuit indicates that the signal is low following the transition, then the signal edge is determined to be falling, in which case the second sampling circuit output is selected for use as the comparator circuit output. In another example, if the first or second sampling circuit indicates that the signal is low, and the late sampling circuit indicates that the signal is high following the transition, then the signal edge is determined to be rising, in which case the first sampling circuit output is selected for use as the comparator circuit output. Implementations of this type may use the same circuitry as FIG. 4, except an additional delay may be programmed into the strobe of e 40 so that the sampling occurs after the sampling performed by r 38 and f 39. Also, the sense of multiplexer 36 may be switched.

In some implementations, the circuitry of FIGS. 1 and 4 may include four sampling circuits—both a late sampling circuit and an early sampling circuit. The outputs of the late and early sampling circuits may be combined logically or otherwise processed to identify a rising or falling signal edge and, thus, to determine whether to select the output R 15a or F 16a as the output of the comparator circuit.

Figure 7:
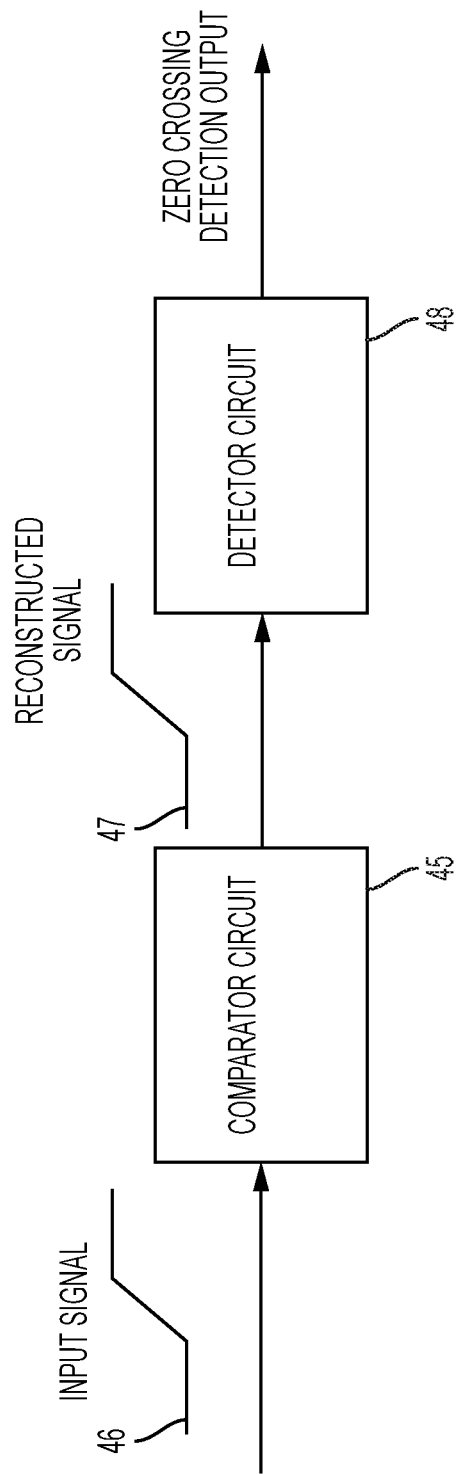
FIG. 7 is a block diagram of an example zero crossing detection circuit.

The comparator circuit described herein may be used in any appropriate circuitry. For example, the comparator circuit may be used for zero crossing detection. Zero-crossing detection includes determining whether a signal crosses a known threshold or, in the case of a differential signal, when the signal crosses its complement. Referring to FIG. 7, a comparator circuit as described herein (e.g., comparator circuit 45) may oversample an input signal 46, thereby providing, as its output signal, a reconstructed version 47 of the input signal 46. A detector circuit 48, which may include one or more comparators, may compare the output signal to an appropriate threshold to identify a zero crossing.

The comparator circuit described herein may be used in test circuitry, e.g., in pin electronics (PE) to sample received test data. In this regard, manufacturers may test devices at various stages of manufacturing. In an example manufacturing process, integrated circuits are fabricated in large quantities on a single silicon wafer. The wafer is cut into individual integrated circuits called dice. Each die is loaded into a frame, and bonding wires are attached to connect the die to leads that extend from the frame. The loaded frame is then encapsulated in plastic or another packaging material to produce a finished product.

Manufacturers have an economic incentive to detect and discard faulty components as early as possible in the manufacturing process. Accordingly, many manufacturers test integrated circuits at the wafer level, before a wafer is cut into dice. Defective circuits are marked and generally discarded prior to packaging, thus saving the cost of packaging defective dice. As a final check, many manufacturers test each finished product before it is shipped. Such a process tests parts in packages which have had additional expense added to them over bare die. So, having accurate test results reduces the need to discard valuable parts.

To test quantities of components, manufacturers commonly use automatic test equipment (ATE) (also referred to as a "tester"). In response to instructions in a test program set (TPS), some ATE automatically generates input signals to be applied to a device under test (DUT), and monitors output signals. The ATE compares the output signals with expected responses to determine whether the DUT is defective. ATE typically includes a computer system and a test instrument or a single device having corresponding functionalities. In some cases, the test instrument provides power to a DUT.

Figure 8:
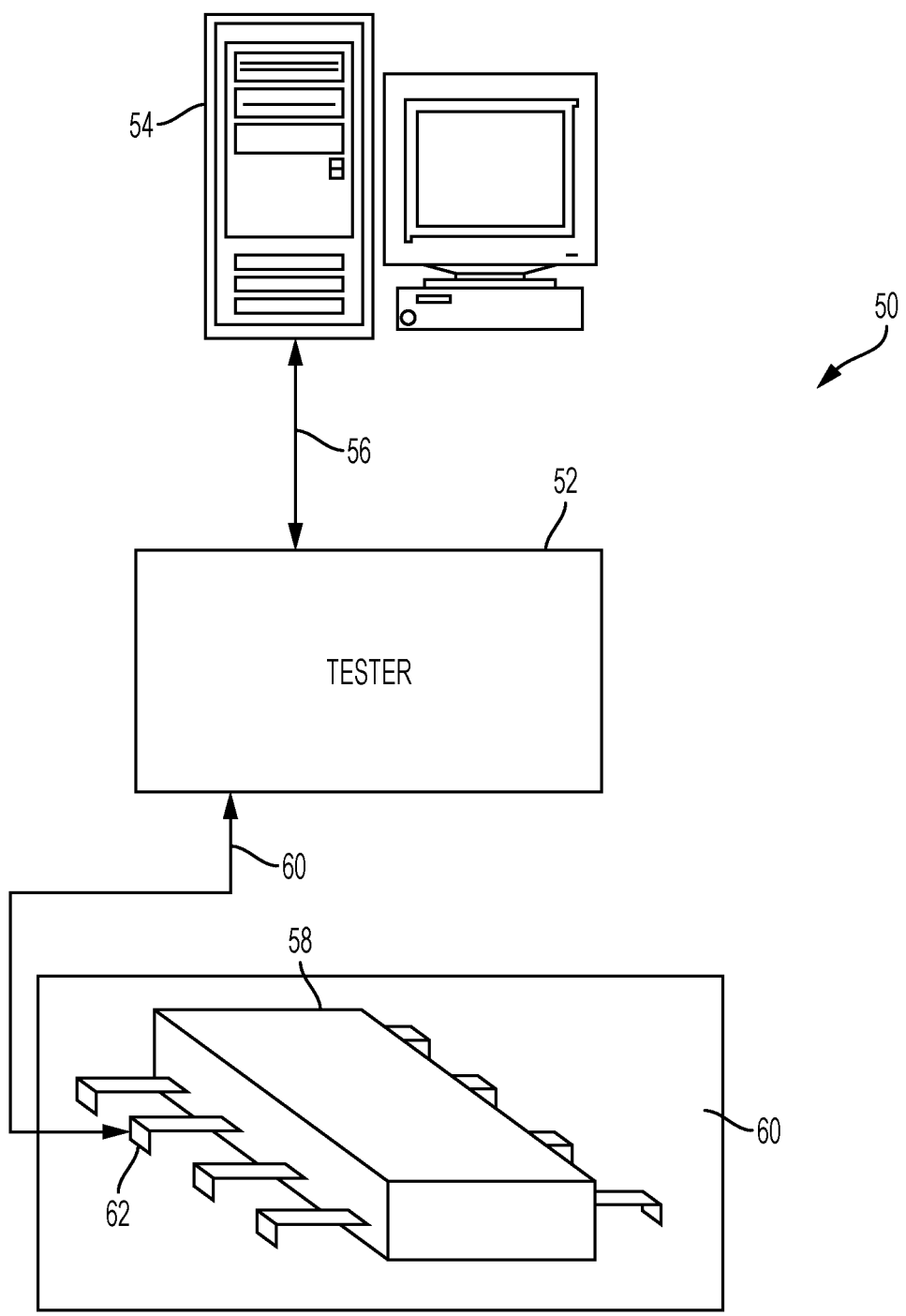
FIG. 8 is a block diagram showing automatic test equipment.

Referring to FIG. 8, an example ATE system 50 for testing a DUT 58, such as a semiconductor device, includes a tester (or "test instrument") 52. Tester 52 may include a number of channels, each of which may include the circuitry of FIGS. 1 and 2, or variations thereof. To control tester 52, system 50 includes a computer system 54 that interfaces with tester 52 over a hardwire connection 56. In an example operation, computer system 54 sends commands to tester 52 to initiate execution of routines and functions for testing DUT 58. Such executing test routines may initiate the generation and transmission of test signals to the DUT 58 and collect responses from the DUT. Various types of DUTs may be tested by system 50. For example, DUTs may be semiconductor devices such as an integrated circuit (IC) chip (e.g., memory chip, microprocessor, analog-to-digital converter, digital-to-analog converter, etc.) or other devices.

To provide test signals and collect responses from the DUT, tester 52 is connected to an interface to the internal circuitry of DUT 58. For example, the DUT may be inserted into a socket in the tester, which contains interfaces to electrical connections between the DUT and the tester. A conductor 60 (e.g., one or more conductive pathways) is connected to the interface and is used to deliver test signals (e.g., switching or DC test signals, etc.) to the internal circuitry of DUT 58. Conductor 60 also senses signals in response to the test signals provided by tester 52. For example, a voltage signal or a current signal may be sensed at pin 62 in response to a test signal and sent over conductor 60 to tester 52 for analysis. Such single port tests may also be performed on other pins included in DUT 58. For example, tester 52 may provide test signals to other pins and collect associated signals reflected back over conductors (that deliver the provided signals). By collecting the reflected signals, the input impedance of the pins may be characterized along with other single port testing quantities. In other test scenarios, a digital signal may be sent over conductor 60 to pin 62 for storing a digital value on DUT 58. Once stored, DUT 58 may be accessed to retrieve and send the stored digital value over conductor 60 to tester 52. The retrieved digital value may then be identified to determine if the proper value was stored on DUT 58.

Along with performing single port measurements, a two-port or multi-port test may also be performed by tester 52. For example, a test signal may be injected over conductor 60 into pin 62 and a response signal may be collected from one or more other pins of DUT 58. This response signal may be provided to tester 52 to determine quantities, such as gain response, phase response, and other throughput measurement quantities.

Figure 9:
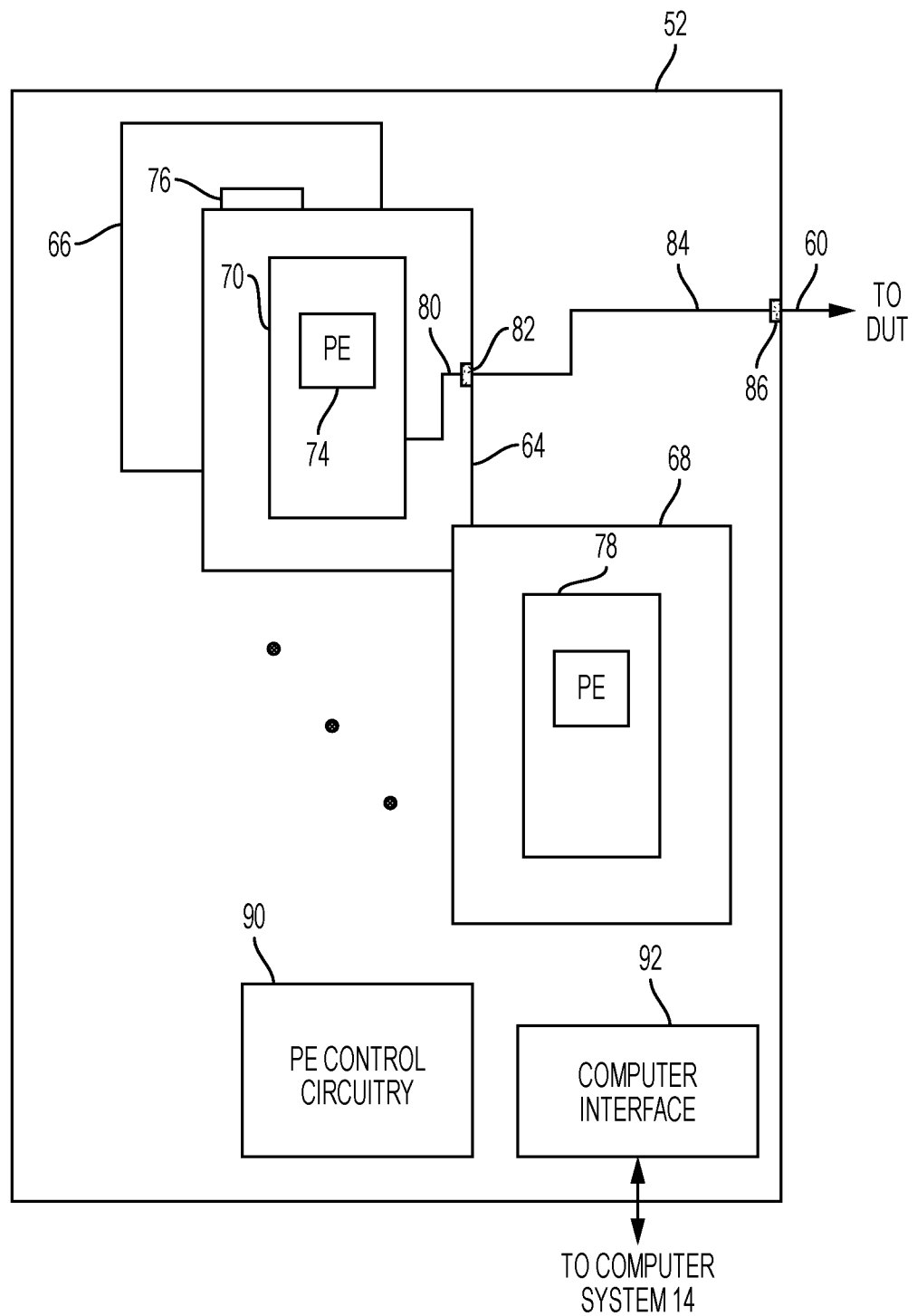
FIG. 9 is a block diagram showing circuitry included in the automatic test equipment of FIG. 8, including the comparator of FIG. 1 or 4.

Referring also to FIG. 9, to send and collect test signals from multiple connector pins of a DUT (or multiple DUTs), tester 52 includes an interface card 64 that can communicate with numerous pins. For example, interface card 64 may transmit test signals to, e.g., 32, 64, or 528 pins and collect corresponding responses. Each communication link to a pin corresponds to a channel such as that shown in FIG. 2 and, by providing test signals to a number of channels, testing time is reduced since multiple tests may be performed simultaneously. Along with having many channels on an interface card, by including multiple interface cards in tester 52, the overall number of channels increases, thereby further reducing testing time. In this example, two additional interface cards 66 and 68 are shown to demonstrate that multiple interface cards may populate tester 52.

Each interface card includes one or more dedicated integrated circuit (IC) chips (e.g., an application specific integrated circuit (ASIC)) for performing particular test functions. For example, interface card 64 includes IC chip 70 for performing pin electronics (PE) tests. Specifically, IC chip 70 has a PE stage 74 that includes circuitry for performing PE tests. Additionally, interface cards 66 and 68 respectively include IC chips 76 and 78 that include PE circuitry. Typically, PE testing involves sending switching test signals, or digital waveforms, to a DUT (e.g., DUT 58) and collecting responses to further characterize the performance of the DUT. One or more comparators of the type described herein may be used to sample signals representing the responses, as described herein. For example, IC chip 70 may transmit (to the DUT) switching test signals that represent a vector of binary values for storage on the DUT. Once these binary values have been stored, the DUT may send signals to the PE, which may use those signals to determine if the correct binary values have been stored. Since digital signals typically include abrupt voltage transitions, the circuitry in PE stage 74 on IC chip 70 operates at a relatively high speed in comparison to the other test circuitry (e.g., parametric measurement unit (PMU) circuitry, which is not shown in the figures). PE testing may also involve adding jitter to test signals and observing DUT operation in the presence of the jitter.

In this example implementation, to pass test signals from interface card 64 to DUT 58, one or more conducting traces 80 connect IC chip 70 to an interface board connector 82 that allows signals to be passed on and off interface board 64. Interface board connector 82 is also connected to one or more conductors 84 that are connected to an interface connector 86, which allow signals to be passed to and from tester 52. In this example, conductor(s) 60 are connected to interface connector 86 for bi-directional signal passage between tester 52 and pins of DUT 58. In some implementations, an interface device may be used to connect one or more conductors from tester 52 to the DUT. For example, the DUT (e.g., DUT 58) may be mounted onto a device interface board (DIB) for providing access to each DUT pin. In such an arrangement, conductor(s) 60 may be connected to the DIB for placing test signals on the appropriate pin(s) (e.g., pin 62) of the DUT.

In some implementations, conducting trace(s) 80 and conductor(s) 84 respectively connect IC chip 70 and interface board 64 for delivering and collecting signals. IC chip 70 (along with IC chips 76 and 78) may have multiple pins (e.g., eight, sixteen, etc.) that are respectively connected with multiple conducting traces and corresponding conductors for providing and collecting signals from the DUT (e.g., via a DIB). Additionally, in some implementations, tester 52 may connect to two or more DIB's for interfacing the channels provided by interface cards 64, 66, and 68 to one or multiple devices under test.

To initiate and control the testing performed by interface cards 64, 66, and 68, tester 52, PE control circuitry 90 provides test parameters (e.g., test signal voltage level, test signal current level, digital values, etc.) for producing test signals and analyzing DUT responses. The PE control circuitry may be implemented using one or more processing devices. Examples of processing devices include, but are not limited to, a microprocessor, a microcontroller, programmable logic (e.g., a field-programmable gate array), and/or combination(s) thereof. Tester 52 also includes a computer interface 92 that allows computer system 54 to control the operations executed by tester 52 and also allows data (e.g., test parameters, DUT responses, etc.) to pass between tester 52 and computer system 54.

While this specification describes example implementations related to "testing" and a "test system," the devices and method described herein may be used in any appropriate system, and are not limited to test systems or to the example test systems described herein.

Testing performed as described herein may be implemented using hardware or a combination of hardware and software. For example, a test system like the ones described herein may include various controllers and/or processing devices located at various points. A central computer may coordinate operation among the various controllers or processing devices. The central computer, controllers, and processing devices may execute various software routines to effect control and coordination of testing and calibration.

Testing can be controlled, at least in part, using one or more computer program products, e.g., one or more computer program tangibly embodied in one or more information carriers, such as one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the testing and calibration can be performed by one or more programmable processors executing one or more computer programs to perform the functions described herein. All or part of the testing and calibration can be implemented using special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer (including a server) include one or more processors for executing instructions and one or more storage area devices for storing instructions and data. Generally, a computer will also include, or be operatively coupled to receive data from, or transfer data to, or both, one or more machine-readable storage media, such as mass PCBs for storing data, e.g., magnetic, magneto-optical disks, or optical disks. Machine-readable storage media suitable for embodying computer program instructions and data include all forms of non-volatile storage area, including by way of example, semiconductor storage area devices, e.g., EPROM, EEPROM, and flash storage area devices; magnetic disks, e.g., internal hard disks or removable disks; magneto-optical disks; and CD-ROM and DVD-ROM disks.

Any "electrical connection" as used herein may imply a direct physical connection or a connection that includes intervening components but that nevertheless allows electrical signals to flow between connected components. Any "connection" involving electrical circuitry mentioned herein, unless stated otherwise, is an electrical connection and not necessarily a direct physical connection regardless of whether the word "electrical" is used to modify "connection".

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

What is claimed is:

1. Circuitry comprising:
a first sampling circuit configured to operate based on a first clock signal, to receive data, and to sample the data, the first clock signal being calibrated to compensate for a first timing error in a rising edge of the data;
a second sampling circuit configured to operate based on a second clock signal, to receive the data, and to sample the data, the second clock signal being calibrated to compensate for a second timing error in a falling edge of the data; and
a third sampling circuit to receive the data and a third clock signal, to sample the data based on the third clock signal to produce sampled data, and to control an output of the circuitry based on the sampled data to be either an output of the first sampling circuit or an output of the second sampling circuit.

2. The circuitry of claim 1, further comprising:
a first delay element to receive the third clock signal and to delay the third clock signal by a first amount to produce the first clock signal; and
a second delay element to receive the third clock signal and to delay the third clock signal by a second amount to produce the second clock signal.

3. The circuitry of claim 2, wherein the first amount is independent of, and different from, the second amount.

4. The circuitry of claim 2, wherein the first amount is based on the first timing error, and the second amount is based on the second timing error.

5. The circuitry of claim 1, further comprising:
a selection circuit configured to receive an output of the third sampling circuit, and to use the output of the third sampling circuit to select either the output of the first sampling circuit or the output of the second sampling circuit.

6. The circuitry of claim 5, wherein the selection circuit comprises a multiplexer controlled by the output of the third sampling circuit.

7. The circuitry of claim 1, wherein the third sampling circuit is configured to sample the data prior to sampling performed by at least one of the first sampling circuit or the second sampling circuit.

8. The circuitry of claim 1, wherein the third sampling circuit is configured to sample the data after sampling performed by at least one of the first sampling circuit or the second sampling circuit.

9. The circuitry of claim 1, wherein the third sampling circuit is configured to sample the data before and after sampling performed by at least one of the first sampling circuit or the second sampling circuit.

10. The circuitry of claim 1, further comprising:
a fourth sampling circuit to receive the output of the circuitry and a fourth clock signal; and
one or more delay elements to generate the fourth clock signal based on the third clock signal;
wherein the one or more delay elements introduce a delay into the third clock signal to produce the fourth clock signal, the delay for ensuring that the fourth clock signal controls the fourth sampling circuit to sample the output when the output has a valid signal level.

11. The circuitry of claim 10, wherein the delay of the one or more delay elements is fixed.

12. The circuitry of claim 10, wherein the delay of the one or more delay elements is programmable.

13. The circuitry of claim 1, wherein when the data is in a low state, the third sampling circuit is configured to control the output of the circuitry to be the output of the first sampling circuit; and
wherein when the data is in a high state, the third sampling circuit is configured to control the output of the circuitry to be the output of the second sampling circuit.

14. The circuitry of claim 1, wherein the first sampling circuit comprises a flip-flop, the second sampling circuit comprises a flip-flop, and the third sampling circuit comprises a flip-flop; and
wherein the first timing error comprises a skew associated with the rising edge of the data, and the second timing error comprises a skew associated with the falling edge of the data.

15. A circuit for detecting data crossing a threshold, comprising:
an input circuit configured to provide data at a first frequency;
a clock circuit configured to provide a data clock signal at a second frequency, the second frequency being different than the first frequency;
sampling circuitry configured to sample the data based on the data clock signal to produce sampled data; and
a detection circuit configured to detect that the sampled data crossed the threshold and, in response, to provide output data;
wherein the sampling circuitry comprises:
a first sampling circuit configured to operate based on a first clock signal, to receive the data, and to sample the data, the first clock signal being calibrated to compensate for a first timing error in a rising edge of the data, the first clock signal being based on the data clock signal;
a second sampling circuit configured to operate based on a second clock signal, to receive the data, and to sample the data, the second first clock signal being calibrated to compensate for a second timing error in a falling edge of the data, the second clock signal being based on the data clock signal; and
a third sampling circuit to receive the data and the data clock signal, to sample the data based on the data clock signal to produce sampled data, and to control an output of the sampling circuitry based on the sampled data to be either an output of the first sampling circuit or an output of the second sampling circuit.

16. The circuit of claim 15, wherein the threshold comprises a zero crossing threshold.

17. The circuit of claim 15, wherein the data is part of a differential signal, and wherein the threshold comprises signals that comprise the differential signal crossing each other.

18. The circuit of claim 15, wherein the sampling circuitry comprises:
a first delay element to receive the data clock signal and to delay the data clock signal by a first amount to produce the first clock signal; and
a second delay element to receive the data clock signal and to delay the data clock signal by a second amount to produce the second clock signal.

19. The circuit of claim 18, wherein the first amount is independent of, and different from, the second amount.

20. The circuit of claim 18, wherein the first amount is based on the first timing error, and the second amount is based on the second timing error.

21. The circuit of claim 15, wherein the sampling circuitry comprises:
a selection circuit configured to receive an output of the third sampling circuit, and to use the output of the third sampling circuit to select either the output of the first sampling circuit or the output of the second sampling circuit.

* * * * *